US 8,796,915 B2

(12) United States Patent
Ooya et al.

(10) Patent No.: US 8,796,915 B2
(45) Date of Patent: Aug. 5, 2014

(54) LED LIGHT BULB

(71) Applicants: Kabushiki Kaisha Toshiba, Tokyo (JP);
Toshiba Materials Co., Ltd., Yokohama (JP)

(72) Inventors: Yasumasa Ooya, Chigasaki (JP);
Masahiko Yamakawa, Yokohama (JP);
Yasuhiro Shirakawa, Yokohama (JP);
Katsutoshi Nakagawa, Yokohama (JP)

(73) Assignees: Kabushiki Kaisha Toshiba, Tokyo (JP);
Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 13/774,574

(22) Filed: Feb. 22, 2013

(65) Prior Publication Data

US 2013/0169147 A1 Jul. 4, 2013

Related U.S. Application Data

(63) Continuation of application No. PCT/JP2011/004863, filed on Aug. 30, 2011.

(30) Foreign Application Priority Data

Aug. 31, 2010 (JP) ................................. 2010-193170

(51) Int. Cl.
*H05B 33/12* (2006.01)
*F21V 9/16* (2006.01)

(52) U.S. Cl.
USPC ......... 313/503; 313/318.01; 362/84; 362/800

(58) Field of Classification Search
None
See application file for complete search history.

(56) References Cited

U.S. PATENT DOCUMENTS

| 8,506,103 B2* | 8/2013 | Iimura et al. .................... 362/84 |
| 2007/0058357 A1 | 3/2007 | Yamaguchi et al. |
| 2012/0155059 A1* | 6/2012 | Hoelen et al. .................. 362/84 |

FOREIGN PATENT DOCUMENTS

| JP | 08-283712 A | 10/1996 |
| JP | 08283712 A | 10/1996 |
| JP | 2000-109826 A | 4/2000 |
| JP | 2000109826 A | 4/2000 |
| JP | 2001-172623 A | 6/2001 |
| JP | 2001172623 A | 6/2001 |
| JP | 2002-359404 A | 12/2002 |
| JP | 2002359404 | 12/2002 |
| JP | 2005-005546 A | 1/2005 |
| JP | 2005005546 A | 1/2005 |
| JP | 20070881234 A | 3/2007 |

(Continued)

OTHER PUBLICATIONS

INternational Search Report, Mar. 12, 2013, 8 pages.*

*Primary Examiner* — Ashok Patel
(74) *Attorney, Agent, or Firm* — Foley & Lardner LLP (57) ABSTRACT

In one embodiment, an LED light bulb includes an LED module, a base part on which the LED module is disposed, and a globe attached to the base part. The LED module includes an ultraviolet to violet light-emitting LED chip mounted on a substrate. A lighting circuit and a bayonet cap are provided at the base part. A phosphor screen emitting white light by absorbing the ultraviolet to violet light emitted from the LED chip is provided on an inner surface of the globe. The phosphor screen has a color in which a* is −10 or more and +10 or less, b* is 0 (zero) or more and +30 or less, and L* is +40 or more when a body color thereof is represented by an L*a*b* color system.

12 Claims, 5 Drawing Sheets

(56) References Cited

FOREIGN PATENT DOCUMENTS

| | | |
|---|---|---|
| JP | 2009040918 A | 2/2009 |
| JP | 2009-170114 A | 7/2009 |
| JP | 2009170114 A | 7/2009 |
| JP | 2010-016223 A | 1/2010 |
| JP | 2010016223 A | 1/2010 |
| JP | 2010-027725 A | 2/2010 |
| JP | 2010-040364 A | 2/2010 |
| JP | 2010027725 A | 2/2010 |
| JP | 2010040364 A | 2/2010 |

* cited by examiner

FIG. 6

LED LIGHT BULB

CROSS-REFERENCE TO RELATED APPLICATIONS

This application is a continuation of prior International Application No. PCT/JP2011/004863 filed on Aug. 31, 2011, which is based upon and claims the benefit of priority from Japanese Patent Application No. 2010-193170 filed on Aug. 31, 2010; the entire contents of all of which are incorporated herein by reference.

FIELD

Embodiments described herein relate to an LED light bulb.

BACKGROUND

A light-emitting device using a light-emitting diode (LED) is widely used for lighting devices such as a backlight of a liquid crystal display device, a signal apparatus, various kinds of switches, a lamp for a vehicle, and a general lighting. A white light-emitting LED lamp in which an LED and a phosphor are combined is focused as an alternative of an incandescent lamp, and development thereof is rapidly advanced. As a light bulb applying an LED lamp (hereinafter, noted as an LED light bulb), for example, one having an integral-type lamp structure is known. In the integral-type lamp, a globe is attached to a base part where a light bulb cap is provided, LED chips are disposed in the globe, further a lighting circuit of the LED chips is provided in the base part.

In a conventional LED light bulb, a combination of a blue light-emitting LED chip (blue LED) and a yellow phosphor (YAG phosphor and so on) emitting yellow light by absorbing blue light emitted from the blue LED is applied, and white light is obtained by a color mixture of the blue light emitted from the blue LED and the yellow light emitted from the yellow phosphor by absorbing the blue light. The LED light bulb in which the blue LED and the yellow phosphor are combined has characteristics in which brightness is easy to be secured. However, the white light based on the color mixture of the blue light from the blue LED and the yellow light from the yellow phosphor deteriorates in color rendering properties evaluated by an average color rendering index (Ra) and so on.

Light distribution of the conventional LED light bulb in which the blue LED and the yellow phosphor are combined is inclined toward a blue component and a yellow component, and light of a red component is insufficient. Therefore, reflected light when an object is seen by the light from the LED light bulb is different from natural light when it is seen under sunlight. In the conventional LED light bulb, the light emitted from the blue LED is used for generation of the white light, and therefore, luminance of a whole of the light bulb becomes uneven. Accordingly, it is difficult to reduce garishness and local dazzle of the light bulb, so-called glare. The blue light emitted from the blue LED strongly tends to go straight, and the light going in a horizontal direction goes straight as it is and is not scattered around, and therefore, it is difficult to make so-called a light distribution angle enough large.

DETAILED DESCRIPTION

An LED light bulb according to an embodiment includes an LED module, a base part on which the LED module is disposed, and a globe attached to the base part to cover the LED module. The LED module includes an ultraviolet to violet light-emitting LED chip mounted on a substrate. A lighting circuit lighting the LED chip and a bayonet cap electrically connected to the lighting circuit are provided at the base part. A phosphor screen separated from the LED chips is provided on an inner surface of the globe. The phosphor screen has a color in which a* is −10 or more and +10 or less, b* is 0 (zero) or more and +30 or less, and L* is +40 or more when a body color thereof is represented by an L*a*b* color system.

Figure 1:
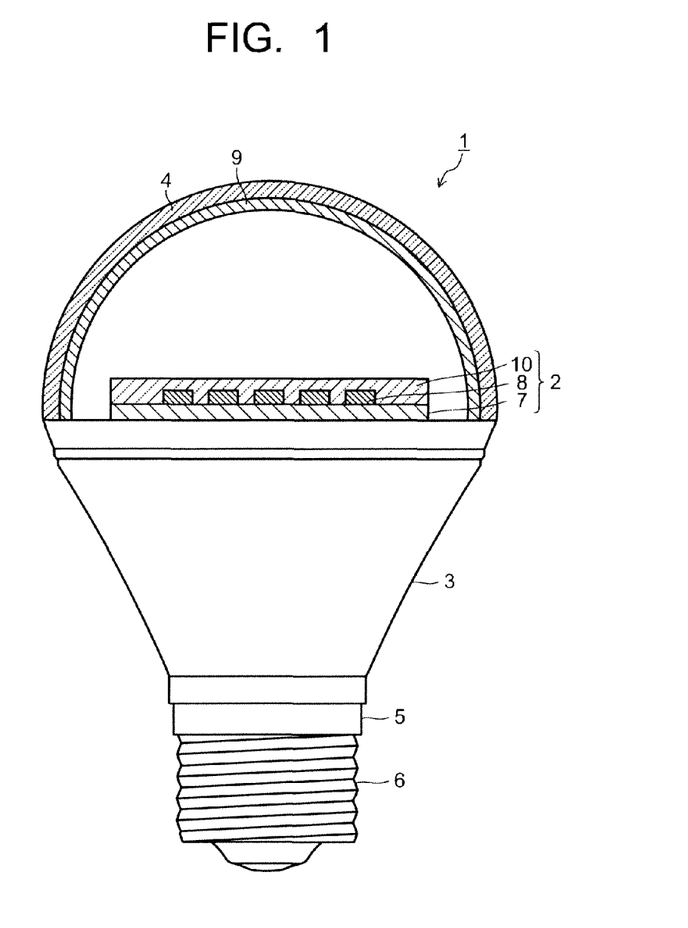
FIG. 1 is a view illustrating an LED light bulb according to a first embodiment by a partial cross section.
Figure 2:
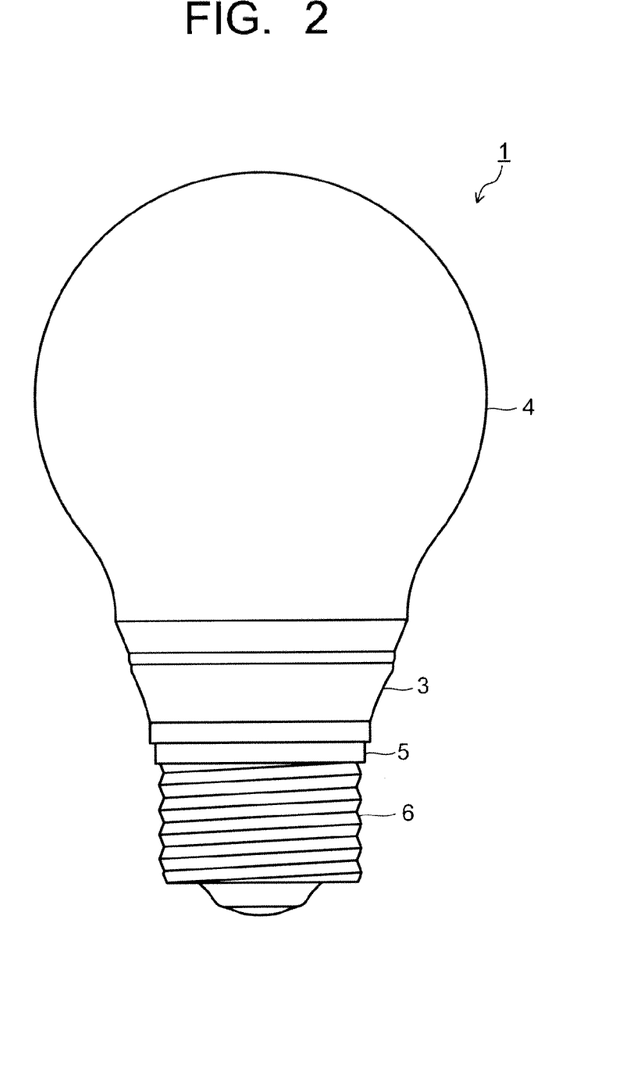
FIG. 2 is a view illustrating an LED light bulb according to a second embodiment.

Hereinafter, an LED light bulb according to an embodiment is described with reference to the drawings. FIG. 1 is a view illustrating a constitution of an LED light bulb according to a first embodiment by a partial cross section. FIG. 2 is a view illustrating an LED light bulb according to a second embodiment. An LED light bulb 1 illustrated in the drawings includes an LED module 2, a base part 3 on which the LED module 2 is disposed, a globe 4 attached on the base part 3 to cover the LED module 2, a bayonet cap 6 attached at a lower end of the base part 3 via an insulating member 5, and a lighting circuit (not-illustrated) provided in the base part 3.

The LED module 2 includes ultraviolet to violet light-emitting LED chips 8 mounted on a substrate 7. The plural LED chips 8 are surface-mounted on the substrate 7. InGaN-based, GaN-based, and AlGaN-based light-emitting diodes are used as the ultraviolet to violet light-emitting LED chips 8. A wiring network (not-illustrated) is provided at a surface (further at inside according to need) of the substrate 7, and electrodes of the LED chips 8 are electrically connected to the wiring network of the substrate 7. A wiring which is not illustrated is drawn out at a side surface or a bottom surface of the LED module 2, and this wiring is electrically connected to the lighting circuit (not-illustrated) provided in the base part 3. The LED chips 8 are lighted by a direct-current voltage applied via the lighting circuit.

A phosphor screen (film) 9 emitting white light by absorbing ultraviolet to violet light emitted from the LED chips 8 is provided on an inner surface of the globe 4. An emission color of the LED light bulb 1 is determined by a combination of a emission wavelength of the LED chip 8 and phosphors constituting the phosphor screen 9. When the white light is obtained by a combination with the ultraviolet to violet light LED chip 8, it is preferable that the phosphor screen 9 is composed of a mixed phosphor (BGR or BYR phosphor) containing a blue phosphor, a green to yellow phosphor, and a red phosphor. The mixed phosphor may further contain at least one phosphor selected from a blue-green phosphor and a deep red phosphor. The phosphor screen 9 includes the mixed phosphor capable of obtaining the white light only by the light-emission from itself (the light emitted from the LED chip 8 is not included).

A shape of the globe 4 is not particularly limited, and a dome shape as illustrated in FIG. 1 and an eggplant shape as illustrated in FIG. 2 can be applied. In FIG. 2, a constitution inside the globe 4 is not illustrated, but the LED light bulb 1 illustrated in FIG. 2 has a similar constitution as the LED light bulb 1 illustrated in FIG. 1 except that the shapes of the globe 4 are different. It is preferable to form the globe 4 by a material having a transparent or white body color of which transmittance of visible light is 90% or more, for example, a glass or a resin. It is thereby possible to effectively take out the white light emitted from the phosphor screen 9 toward outside of the light bulb 1. Further, it is possible to make a later-described appearance color of the LED light bulb 1 at a non-lighted time fine. The globe 4 has a size equivalent to, for example, an incandescent lamp.

The phosphor screen 9 in the LED light bulb 1 according to the embodiment is provided on the inner surface of the globe 4 so as to be separated from the LED chips 8, different from a conventional LED module in which phosphor particles are dispersed in a sealing resin of LED chips. Electric energy applied on the LED light bulb 1 is converted into the ultraviolet to violet light at the LED chip 8, and further converted into longer-wavelength light at the phosphor screen 9 to be emitted as white light. The white light emitted from the LED light bulb 1 is constituted only by the light-emission of the phosphor screen 9 different from the conventional LED light bulb in which the blue LED and the yellow phosphor are combined.

In the LED light bulb 1, the phosphor screen 9 provided on a whole of the inner surface of the globe 4 emits light, and therefore, a surface emission of the whole of the phosphor screen 9 is enabled, and the white light spreads from the phosphor screen 9 in all directions which is different from the conventional LED module in which the phosphor particles are dispersed in the sealing resin. Further, the white light is obtained only by the light-emission from the phosphor screen 9 which is different from the conventional LED light bulb in which the blue LED and the yellow phosphor are combined, and therefore, it is possible to suppress local luminance unevenness, or the like. It is thereby possible to obtain the white light without glare, even and soft. Namely, it is possible to drastically reduce the glare of the LED light bulb 1 compared to the conventional LED light bulb in which the blue LED and the yellow phosphor are combined.

When the ultraviolet to violet light-emitting LED chips 8 are used as an excitation source of the LED light bulb 1, it is possible to constitute the phosphor screen 9 with various phosphors which is different from the conventional LED light bulb in which the blue LED and the yellow phosphor are combined. Namely, a range of selection of the kinds of phosphors constituting the phosphor screen 9 becomes wider, and therefore, it is possible to increase the color rendering properties of the white light emitted from the LED light bulb 1. Specifically, the white light of which correlated color temperature is 6500 K or less, and the average color rendering index Ra is 85 or more can be easily obtained. The white light as stated above is obtained, and thereby, it becomes possible to improve usefulness and so on of the LED light bulb 1 as an alternative of the incandescent lamp.

The ultraviolet to violet light-emitting LED (emission peak wavelength: 350 nm to 430 nm) may be used as the LED chip 8, but particularly, it is preferable to use the LED chip 8 of which emission peak wavelength is in a range of 370 nm to 415 nm and a half value width of an emission spectrum is in a range of 10 nm to 15 nm. When the LED chip 8 as stated above and the phosphor screen 9 constituted by the above-stated mixed phosphor (a mixed phosphor of BGR or BYR phosphor, further the blue-green phosphor and the deep red phosphor are added according to need) are combined to be used, the white light of which correlated color temperature (emission color) is stable independent from an output variation of the LED chip 8 can be obtained, and it is possible to improve yield of the LED light bulb 1. In the conventional combination of the blue LED and the yellow phosphor, the output variation of the LED chip directly affects on the correlated color temperature (emission color), and therefore, the yield of the LED light bulb is easy to be lowered.

The plural LED chips 8 mounted on the substrate 7 are preferable to be covered with a transparent resin layer 10. Namely, the LED module 2 is preferable to include the plural LED chips 8 surface-mounted on the substrate 7 and the transparent resin layer 10 provided on the substrate 7 so as to cover the plural LED chips 8. For example, a silicon resin, an epoxy resin, and so on are used for the transparent resin layer 10, and it is particularly preferable to use the silicon resin excellent in ultraviolet light resistant properties. As stated above, the plural LED chips 8 are covered with the transparent resin layer 10, and thereby, the lights emitted from the LED chips 8 propagate with each other, local strong and weak of light to be a cause of the glare is softened, and a taking out efficiency of light can be increased.

Further, the phosphor screen 9 emitting white light is provided on the inner surface of the globe 4, and thereby, it is possible to make the light distribution angle of the LED light bulb 1 large, and in addition, it is possible to suppress luminance deterioration over time resulting from a temperature increase and so on of the phosphor screen 9. Here, the light distribution angle represents a spread of light to a periphery of the light bulb. When the light distribution angle is small, it is felt that brightness is insufficient as a whole of the light bulb even when luminance just under the light bulb is high. The light distribution angle in the present embodiment is obtained as follows. An angle where luminance becomes a half relative to center luminance of the light bulb is found as for right and left both sides, and both angles are summed up. When right and left are symmetrical, the light distribution angle is a double value of one side angle.

Figure 4:
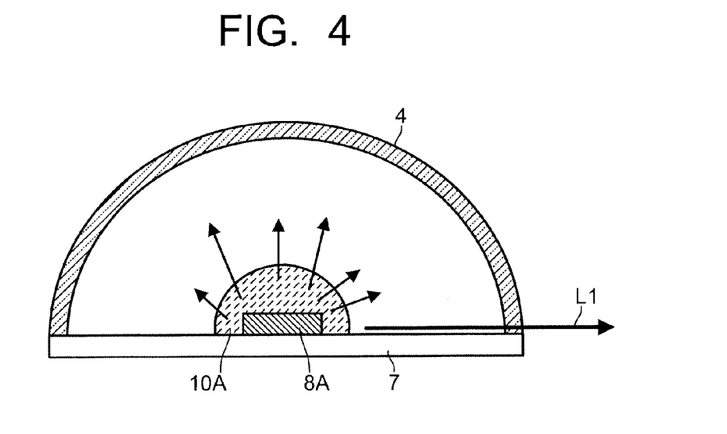
FIG. 4 is a view describing a transmitting state of white light of the LED light bulb of which LED chips are covered with a resin layer containing a phosphor.
Figure 6:
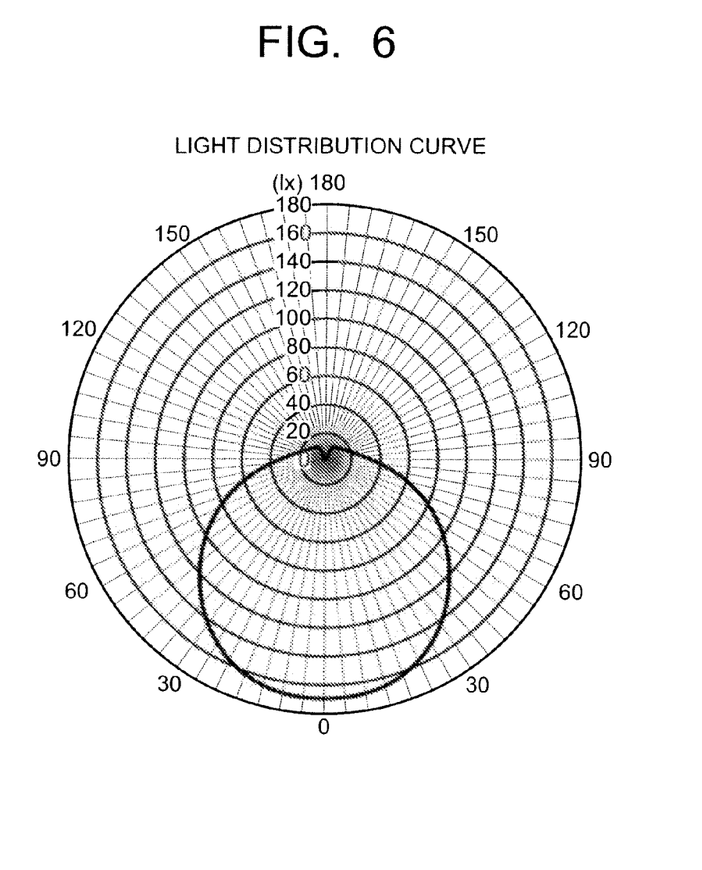
FIG. 6 is a view illustrating an example of a light distribution angle of the LED light bulb of which LED chips are covered with a resin layer containing a phosphor.

Namely, as illustrated in FIG. 4, in a conventional structure in which LED chips 8A are covered with a resin layer 10A containing a phosphor, an energy emitted from the LED chips 8A is converted into visible light by the phosphor in the resin layer 10A, and this visible light disperses in various directions from the resin layer 10A. Note that light going horizontally relative to a surface of the substrate 7 where the LED chips 8A are mounted goes straight as it is and the light does not spread to a rear side of the substrate 7 (at downward from the substrate 7) as illustrated by an arrow L1 in the drawing. Accordingly, the light distribution angle of the conventional LED light bulb in which the LED chips 8A are covered with the resin layer 10A containing the phosphor is approximately 120 degrees as illustrated in FIG. 6.

When the phosphor screen constituted by the yellow phosphor and so on is formed on the inner surface of the globe in the conventional LED light bulb in which the blue LED and the yellow phosphor are combined, the light emission from the phosphor screen disperses to the periphery, and therefore, the light distribution angle becomes larger than the LED light bulb in which the LED chips 8A are covered with the resin layer 10A containing the phosphor. However, the light emitted from the blue LED constituting a part of the white light has a strong going-straight property, transmits the globe and is emitted toward outside under the state, and therefore, the light does not spread to the rear side of the substrate 7 (at downward of the substrate 7). Accordingly, there is a limit in improvement of the light distribution angle of the LED light bulb.

Figure 3:
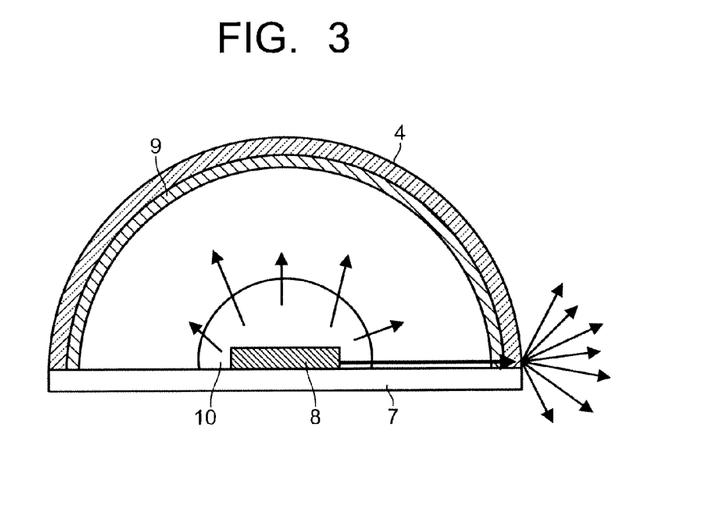
FIG. 3 is a view describing a diffusion state of white light of the LED light bulb according to the embodiment.
Figure 5:
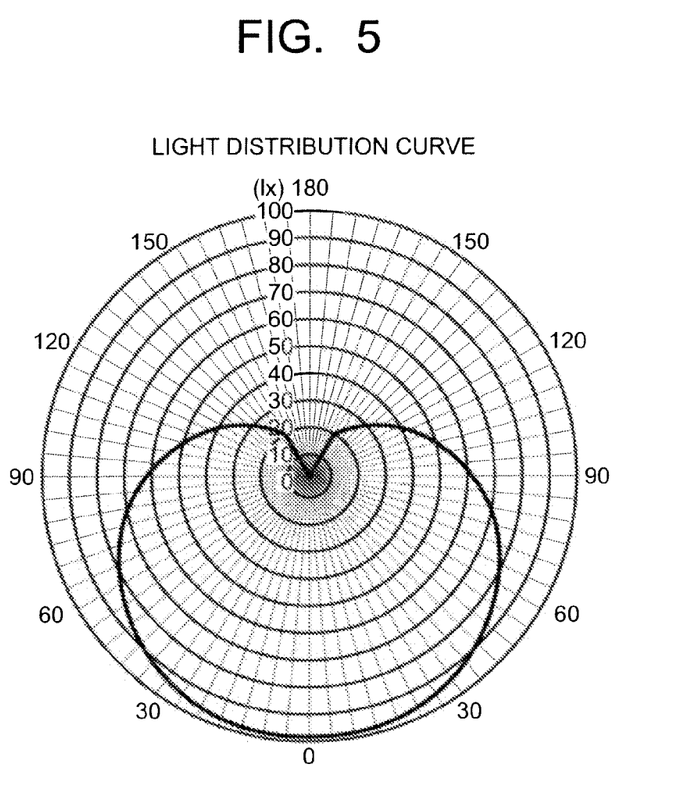
FIG. 5 is a view illustrating an example of a light distribution angle of the LED light bulb according to the embodiment.

On the other hand, the whole of the phosphor screen 9 provided on the inner surface of the globe 4 is surface-emitted and the white light is obtained only by the light-emission from the phosphor screen 9 in the LED light bulb 1 according to the embodiment. Accordingly, the white light spreads from the phosphor screen 9 in all directions as illustrated in FIG. 3. Namely, all of light-emission components constituting the white light are emitted at an inner side of the globe 4, and the white light is diffused from the whole surface of the phosphor screen 9 to the periphery, and therefore, the spread of the white light in itself to a back surface of the light bulb becomes large. Accordingly, it becomes possible to more effectively make the light distribution angle of the white light of the LED light bulb 1 large. As illustrated in FIG. 5, the light distribution angle of the LED light bulb 1 becomes 200 degrees or more.

As for the luminance deterioration over time resulting from the temperature increase and so on of the phosphor screen 9, the temperature of the phosphor is easy to increase based on the temperature increase of the LED chips 8A when the LED light bulb is continuously lighted in the conventional structure in which the LED chips 8A are covered with the resin layer 10A containing the phosphor. Accordingly, the luminance deterioration resulting from the temperature increase of the phosphor is easy to occur. On the other hand, the phosphor screen 9 is provided on the inner surface of the globe 4 to be separated from the LED chips 8, and thereby, it is possible to suppress the temperature increase of the phosphor screen 9 even when the temperature of the LED chips 8 increases. For example, the temperature of the phosphor screen 9 increases up to approximately around 60° C. when there is an enough distance between the phosphor screen 9 and the LED chip 8. Accordingly, it is possible to suppress the luminance deterioration over time during the lighting time of the LED light bulb 1.

As stated above, the phosphor screen 9 is constituted by the mixed phosphor (BGR or BYR phosphor) containing the blue phosphor, the green to yellow phosphor, and the red phosphor, and further the mixed phosphor containing at least one selected from the blue-green phosphor and the deep red phosphor according to need. It is preferable to use the phosphors represented in the following as each phosphor constituting the mixed phosphor from points of view of a combination with the ultraviolet to violet light from the LED chip 8, the color temperature and the color rendering properties (average color rendering index Ra and so on) of the obtained white light, an appearance color of the LED light bulb 1 at the non-lighted time, and so on.

A phosphor of which light emission peak wavelength is within a range of 430 nm to 460 nm is used as the blue phosphor, and for example, it is preferable to use an europium (Eu) activated alkaline earth chlorophosphate phosphor having a composition represented by a formula (1).

General Formula: $(Sr_{1-x-y-z}Ba_xCa_yEu_z)_5(PO_4)_3Cl$ (1)

where, the formula, x, y, and z are numbers satisfying $0 \leq x < 0.5$, $0 \leq y < 0.1$, $0.005 \leq z < 0.1$.

A phosphor of which light emission peak wavelength is within a range of 490 nm to 580 nm is used as the green to yellow phosphor, and for example, it is preferable to use at least one selected from an europium (Eu) and manganese (Mn) activated alkaline earth aluminate phosphor having a composition represented by a formula (2), an europium (Eu) and manganese (Mn) activated alkaline earth silicate phosphor having a composition represented by a formula (3), a cerium (Ce) activated rare-earth aluminate phosphor having a composition represented by a formula (4), an europium (Eu) activated SiAlON phosphor having a composition represented by a formula (5), and an europium (Eu) activated SiAlON phosphor having a composition represented by a formula (6).

General Formula: $(Ba_{1-x-y-z}Sr_xCa_yEu_z)(Mg_{1-u}Mn_u)Al_{10}O_{17}$ (2)

where, x, y, z, and u are numbers satisfying $0 \leq x < 0.2$, $0 \leq y < 0.1$, $0.005 < z < 0.5$, $0.1 < u < 0.5$.

General Formula: $(Sr_{1-x-y-z-u}Ba_xMg_yEu_zMn_u)_2SiO_4$ (3)

where, x, y, z, and u are numbers satisfying $0.1 \leq x \leq 0.35$, $0.025 \leq y < 0.105$, $0.025 \leq z \leq 0.25$, $0.0005 \leq u \leq 0.02$.

General Formula: $RE_3A_xAl_{5-x-y}B_yO_{12}:Ce_z$ (4)

where, RE is at least one element selected from Y, Lu, and Gd, A and B are a pair of elements where (A, B) is any of (Mg, Si), (B, Sc), (B, In), and x, y, and z are numbers satisfying $x < 2$, $y < 2$, $0.9 \leq x/y \leq 1.1$, $0.05 \leq z \leq 0.5$.

General Formula: $(Si,Al)_6(O,N)_8:Eu_x$ (5)

where, x is a number satisfying $0 < x < 0.3$.

General Formula: $(Sr_{1-x}Eu_x)_\alpha Si_\beta Al_\gamma O_\delta N_\omega$ (6)

where, x, α, β, γ, δ and ω are numbers satisfying $0 < x < 1$, $0 < \alpha \leq 3$, $12 \leq \beta \leq 14$, $2 \leq \gamma \leq 3.5$, $1 \leq \delta \leq 3$, $20 \leq \omega \leq 22$.

A phosphor of which light emission peak wavelength is within a range of 580 nm to 630 nm is used as the red phosphor, and for example, it is preferable to use at least one selected from an europium (Eu) activated lanthanum sulfide phosphor having a composition represented by a formula (7), an europium (Eu) activated yttrium oxide phosphor having a composition represented by a formula (8), an europium (Eu) activated CASN phosphor having a composition represented by a formula (9), and an europium (Eu) activated SiAlON phosphor having a composition represented by a formula (10).

General Formula: $(La_{1-x-y}Eu_xM_y)_2O_2S$ (7)

where, M is at least one element selected from Sm, Ga, Sb, and Sn, x and y are numbers satisfying $0.08 \leq x < 0.16$, $0.000001 \leq y < 0.003$.

General Formula: $(Y_{1-x-y}Eu_xBi_y)_2O_3$ (8)

where, x and y are numbers satisfying $0.01 \leq x < 0.15$, $0.001 \leq y < 0.05$.

General Formula: $Ca_{1-x-y}Sr_xEu_y)SiAlN_3$ (9)

where, x and y are numbers satisfying $0 \leq x < 0.4$, $0 < y < 0.5$.

General Formula: $(Sr_{1-x}Eu_x)_\alpha Si_\beta Al_\gamma O_\delta N_\omega$ (10)

where, x, α, β, γ, δ and ω are numbers satisfying $0 < x < 1$, $0 < \alpha \leq 3$, $5 \leq \beta \leq 9$, $1 \leq \gamma \leq 5$, $0.5 \leq \delta \leq 2$, $5 \leq \omega \leq 15$.

A phosphor of which light emission peak wavelength is within a range of 460 nm to 490 nm is used as the blue-green phosphor, and for example, it is preferable to use an europium (Eu) and manganese (Mn) activated alkaline earth silicate phosphor having a composition represented by a formula (11).

General Formula: $(Ba_{1-x-y-z-u}Sr_xMg_yEu_zMn_u)_2SiO_4$ (11)

where, x, y, z, and u are numbers satisfying $0.1 \leq x \leq 0.35$, $0.025 \leq y \leq 0.105$, $0.025 \leq z \leq 0.25$, $0.0005 \leq u \leq 0.02$.

A phosphor of which light emission peak wavelength is within a range of 630 nm to 780 nm is used as the deep red phosphor, and for example, it is preferable to use a manganese (Mn) activated magnesium Fluorogermanate phosphor having a composition represented by a formula (12).

General Formula: $\alpha MgO \cdot \beta MgF_2 \cdot (Ge_{1-x}Mn_x)O_2$ (12)

where, $\alpha$, $\beta$, and x are numbers satisfying $3.0 \leq \alpha \leq 4.0$, $0.4 \leq \beta \leq 0.6$, $0.001 \leq x \leq 0.5$.

A ratio of each phosphor constituting the mixed phosphor is appropriately set in accordance with an emission color of the LED light bulb 1. For example, it is preferable for the mixed phosphor to contain the blue phosphor within a range of 10 mass % to 60 mass %, the blue-green phosphor within a range of 0 mass % to 10 mass %, the green to yellow phosphor within a range of 1 mass % to 30 mass %, the red phosphor within a range of 30 mass % to 90 mass %, and the deep red phosphor within a range of 0 mass % to 35 mass %, where a total amount of each phosphor is 100 mass %. According to the mixed phosphor as stated above, it is possible to obtain the white light of a wide range of which correlated color temperature is 6500 K to 2500 K by the same kind of phosphor. In case of the conventional combination of the blue LED and the yellow phosphor, it is difficult to adjust a bulb color of 2800 K including a deviation thereof by only the combination of two colors, and it becomes necessary to add the red phosphor emitting light by blue excitation.

Incidentally, in the conventional incandescent lamp, a transparent glass, an opalescent glass, or the like is used as the material of the globe, therefore, it is a generally accepted common sense for a user in which an appearance of a light bulb globe is transparent or white, and it is an appearance color intimated for a long time. On the other hand, there is a case when the appearance color at the non-lighted time becomes yellow, orange, or the like in the LED light bulb depending on a kind of the phosphor. In the conventional LED light bulb in which the blue LED and the yellow phosphor are combined, the appearance color is easy to be near a body color of the phosphor screen when the phosphor screen is formed at the inner surface of the globe.

The appearance color of the LED light bulb at the non-lighted time is not directly associated with emission characteristics of the lamp, but a commercial value is lowered because misunderstanding such that the appearance color at the non-lighted time is the same as the emission color of the light bulb is given, or it is impossible to correspond to various requirements for the LED light bulb if the appearance color is limited to a specific color. It is therefore preferable that the appearance color of the LED light bulb at the non-lighted time is white or transparent, and a color near white as much as possible is desired when it is colored.

In the LED light bulb 1 according to the embodiment, the body color of the phosphor screen 9 is a color in which a* is −10 or more and +10 or less, b* is 0 (zero) or more and +30 or less, and L* is +40 or more when it is represented by an L*a*b* color system. The L*a*b* color system (L star A star B star color system) is a method used to represent an object color, it is normalized by Commission Internationale de l'Eclairage (CIE) in 1976, and it is defined in JIS Z-8729 in Japan. The L* represents lightness, the a* and the b* represent hue and chroma. As the value of L* is larger, it is brighter. The a* and the b* represent a color direction, and the a* indicates a red direction, the −a* indicates a green direction, the b* indicates a yellow direction, and the −b* indicates a blue direction.

The above-stated numeric values of the L*a*b* color system represent that the body color of the phosphor screen 9 has the hue of white to light green or light yellow, and the chroma and the lightness are high. When the phosphor screen 9 having such the body color is used, it is possible to approximate the appearance color of the LED light bulb 1 at the non-lighted time to the incandescent lamp, and to increase the commercial value of the LED light bulb 1. The phosphor screen 9 is formed by the mixed phosphor in the LED light bulb 1 of the embodiment, and therefore, it is possible to easily obtain the phosphor screen 9 having the body color as stated above by appropriately selecting each phosphor constituting the mixed phosphor.

Among each of the numeric values of the L*a*b* color system representing the body color of the phosphor screen 9, the body color becomes strong green when the a* is less than −10, and becomes strong red when the a* exceeds +10. The body color becomes strong blue when the b* is less than 0 (zero), and becomes strong yellow when the b* exceeds +30. The body color deteriorates in lightness when the L* is less than +40. In any case, the appearance color of the LED light bulb 1 at the non-lighted time becomes a deep color or a dark color of which commercial value is low. It is more preferable that the a* is −5 or more and +5 or less, the b* is 0 (zero) or more and 20 or less, and the L* is 70 or more in the body color of the phosphor screen 9.

The above-stated body colors of the respective phosphors are illustrated in Table 1. The body colors illustrated in Table 1 are ones in which each phosphor is independently coated on the inner surface of the globe, and the body color of each phosphor screen is represented by the L*a*b* color system. The body color (L*a*b*) is measured by using Spectro Photo Meter CM2500d manufactured by Konica-Minolta, an average value of values measured by directly bringing a color measuring part into contact with arbitrary three points at a surface of the phosphor screen is represented. The body color of the phosphor is measured by using the phosphor having an arbitrary representative composition from among a composition range allowed to each phosphor. The body color of the phosphor is different caused by a delicate composition deviance within the allowed composition range, but a difference of the body color caused by a difference of the phosphor kind and the emission color is larger than the difference of the body color caused by the composition difference within the allowed range. A comparative evaluation is performed by each representative composition in Table 1.

TABLE 1

| Phosphor (Composition) | Body color of phosphor screen | | | |
| --- | --- | --- | --- | --- |
| | L* | a* | b* | 評価 |
| Eu activated alkaline earth chlorophosphate phosphor (B) $((Sr_{0.604}Ba_{0.394}Eu_{0.002})_5(PO_4)_3Cl)$ | 101.10 | −3.67 | −6.90 | A |

TABLE 1-continued

| Phosphor (Composition) | Body color of phosphor screen | | | 評価 |
|---|---|---|---|---|
| | L* | a* | b* | |
| Eu and Mn activated alkaline earth aluminate phosphor (GY1) $((Ba_{0.9}Mg_{0.5}Eu_{0.2}Mn_{0.4})Al_{10}O_{17})$ | 103.80 | −34.74 | 27.20 | B |
| Eu and Mn activated alkaline earth silicate phosphor (GY2) $((Sr_{0.675}Ba_{0.25}Mg_{0.0235}Eu_{0.05}Mn_{0.0015})_2SiO_4)$ | 108.00 | −40.49 | 74.10 | C |
| Ce activated rare-earth aluminate phosphor (GY3) $(Y_3MgAl_3SiO_{12}:Ce^{3+})$ | 102.43 | −0.51 | 56.32 | C |
| Eu activated SiAlON phosphor (GY4) $((Si,Al)_6(O,N)_8:Eu^{2+})$ | 97.01 | −20.60 | 45.30 | C |
| Eu activated SiAlON phosphor (GY5) $((Sr_{0.8}Eu_{0.2})_3Si_{13}Al_3O_3N_{22})$ | 97.23 | −17.89 | 54.42 | C |
| Eu activated lanthanum sulfide phosphor (R1) $((La_{0.9}Eu_{0.1})_2O_2S)$ | 97.22 | 10.10 | 9.11 | B |
| Eu activated yttrium oxide phosphor (R2) $((Y_{0.89}Eu_{0.1}Bi_{0.01})_2O_3)$ | 97.10 | 0.20 | 5.40 | A |
| Eu activated CASN phosphor (R3) $((Ca_{0.7}Sr_{0.1}Eu_{0.2})SiAlN_3)$ | 90.17 | 44.60 | 47.05 | C |
| Eu activated SiALON phosphor (R4) $((Sr_{0.6}Eu_{0.4})_2Si_7Al_4ON_{14})$ | 90.36 | 31.11 | 60.22 | C |
| Eu and Mn activated alkaline earth silicate phosphor (BG) $((Sr_{0.225}Ba_{0.65}Mg_{0.0235}Eu_{0.1}Mn_{0.0015})_2SiO_4)$ | 103.80 | −38.47 | 40.05 | C |
| Mn activated magnesium phlorogermanate phosphor (DR) $(3.5MgO \cdot 0.5MgF_2 \cdot (Ge_{0.75}Mn_{0.25})O_2)$ | 97.98 | 1.95 | 13.04 | A |

The body colors of the 12 kinds of phosphor screens illustrated in Table 1 are roughly divided into three groups. The phosphors to which "A" marks are given have the body color of white or corresponding to white, and it is possible to satisfy the body color at an area particularly near white among the above-stated body color of the phosphor screen 9. On the other hand, the phosphors to which "C" marks are given have the body color of deep yellow, deep green, deep pink, and so on, and it is impossible to satisfy the above-stated body color of the phosphor screen 9 when it is used independently. The phosphors to which "B" marks are given have intermediate characteristics of the both, and it is possible to satisfy the above-stated body color of the phosphor screen 9.

The emission color of the LED light bulb 1 is white, therefore, the phosphors illustrated in Table 1 are not independently used, and the white light-emission is obtained by mixing plural kinds of phosphors. Accordingly, it is possible to use even the phosphors to which the "C" marks are given in Table 1 by mixing with the other phosphor. Note that when a mixing ratio of the phosphor to which the "C" mark is given is too high, there is a possibility when the above-stated body color of the phosphor screen 9 is not satisfied even in the case as stated above. It is preferable to set a total content of the phosphor to which the "C" mark is given to be 20 mass % or less in the mixed phosphor constituting the phosphor screen 9.

Namely, it is possible to make the body color of the phosphor screen 9 white to light green or light yellow with good repeatability by setting a total content of the europium and manganese activated alkaline earth silicate phosphor (GY phosphor) having the composition represented by the formula (3), the cerium activated rare-earth aluminate phosphor (GY phosphor) having the composition represented by the formula (4), the europium activated SiAlON phosphor (GY phosphor) having the composition represented by the formula (5), the europium activated SiAlON phosphor (GY phosphor) having the composition represented by the formula (6), the europium activated CASN phosphor (R phosphor) having the composition represented by the formula (9), the europium activated SiAlON phosphor (R phosphor) having the composition represented by the formula (10), and the europium and manganese activated alkaline earth silicate phosphor (BG phosphor) having the composition represented by the formula (11) to be 20 mass % or less of the mixed phosphor. It is more preferable to set the total content of the above-stated phosphors to be 10 mass % or less.

The phosphor screen 9 is formed by, for example, mixing a powder of the mixed phosphor with a binder resin, this mixture (slurry) is coated on the inner surface of the globe 4, and thereafter, heated and cured. The mixed phosphor powder is preferable to have an average particle size (a median of a particle size distribution (D50)) within a range of 3 μm to 50 μm. The mixed phosphor (phosphor particle) having the average particle size as stated above is used, and thereby, it is possible to increase an absorption efficiency of the ultraviolet to violet light emitted from the LED chip 8, and to improve the luminance of the LED light bulb 1.

A film thickness of the phosphor screen 9 is preferable to be within a range of 80 μm to 800 μm. When the ultraviolet to violet light-emitting LED chips 8 are used as an excitation source of the phosphor screen 9, it is preferable to suppress a leakage of ultraviolet ray from the globe 4. There is a possibility in which the ultraviolet ray leaked from the globe 4 has an adverse affect on printed matters, foods, chemicals, human bodies, and so on existing in a vicinity and a disposition space of the LED light bulb 1. When the film thickness of the phosphor screen 9 is less than 80 μm, a leakage amount of the ultraviolet ray becomes large. On the other hand, when the film thickness of the phosphor screen 9 exceeds 800 μm, the brightness of the LED light bulb 1 is lowered. According to the phosphor screen 9 of which film thickness is 80 μm to 800 μm, it is possible to suppress the lowering of the brightness of the LED light bulb 1 while reducing the amount of the ultraviolet ray (an energy amount of the ultraviolet ray) leaked from the globe 4 to, for example, 0.3 mW/nm/lm or less. It is more preferable that the film thickness of the phosphor screen 9 is within a range of 150 μm to 600 μm.

The LED light bulb 1 according to the embodiment is manufactured by as stated below. At first, a phosphor slurry containing the phosphor powder is prepared. The phosphor slurry is prepared by, for example, mixing the phosphor powder with a binder resin such as a silicon resin, an epoxy resin, a polyurethane resin, and a filler such as alumina, silica. A mixing ratio of the phosphor and the binder resin is appropriately selected depending on the kind and the particle size of the phosphor, but for example, when the phosphor is set to be 100 parts by mass, it is preferable that the binder resin is within a range of 20 parts by mass to 1000 parts by mass. It is preferable to appropriately set the kind of phosphor, the average particle size, the mixing ratio, and so on according to target white light from the above-stated condition ranges.

Next, the phosphor slurry is coated on the inner surface of the globe 4. The coating of the phosphor slurry is performed by, for example, a spray method, a dip method, a method rotating the globe 4, or the like to evenly coat on the inner surface of the globe 4. Next, a coating film of the phosphor slurry is heated and dried by using a heating device such as a drier and an oven, to thereby form the phosphor screen (film) 9 at the inner surface of the globe 4. After that, the globe 4 having the phosphor screen 9 is attached to the base part 3 equipped with the LED module 2, the base 6, and so on, and thereby, a target LED light bulb 1 is manufactured.

EXAMPLES

Next, concrete examples and evaluation results thereof are described.

Examples 1 to 9

At first, an Eu activated alkaline earth chlorophosphate $((Sr_{0.604}Ba_{0.394}Eu_{0.002})_5(PO_4)_3Cl)$ phosphor of which average particle size is 40 μm is prepared as the blue (B) phosphor, an Eu and Mn activated alkaline earth silicate $((Sr_{0.225}Ba_{0.65}Mg_{0.0235}Eu_{0.1}Mn_{0.0015})_2SiO_4)$ phosphor of which average particles size is 20 μm is prepared as the blue-green (BG) phosphor, an Eu and Mn activated alkaline earth aluminate silicate $((Ba_{0.9}Mg_{0.5}Eu_{0.2}Mn_{0.4})Al_{10}O_{17})$ phosphor (GY1) of which average particle size is 38 μm, an Eu and Mn activated alkaline earth silicate $((Sr_{0.675}Ba_{0.25}Mg_{0.0235}Eu_{0.05}Mn_{0.0015})_2SiO_4)$ phosphor (GY2) of which average particle size is 17 μm, a Ce activated rare-earth aluminate $(Y_3MgAl_3SiO_{12}:Ce^{3+})$ phosphor (GY3) of which average particle size is 10 μm, an europium activated SiAlON $((Si, Al)_6(O, N):Eu^{2+})$ phosphor (GY4) of which average particle size is 15 μm, and an europium activated SiAlON $((Sr_{0.8}Eu_{0.2})_3Si_nAl_3O_3N_{22})$ phosphor (GY5) of which average particle size is 20 μm are prepared as the green to yellow (GY) phosphor.

An Eu activated lanthanum sulfide $((La_{0.9}Eu_{0.1})_2O_2S)$ phosphor (R1) of which average particle size is 45 μm, an Eu activated yttrium oxide $((Y_{0.89}Eu_{0.1}Bi_{0.01})_2O_3)$ phosphor (R2) of which average particle size is 4 μm, an Eu activated CASN $((Ca_{0.6}Sr_{0.3}Eu_{0.1})SiAlN_3)$ phosphor (R3) of which average particle size is 25 μm, and an Eu activated SiAlON $((Sr_{0.6}Eu_{0.4})_2Si_7Al_4ON_{14})$ phosphor (R4) of which average particle size is 11 μm are prepared as the red (R) phosphor, and an Mn activated magnesium phlorogermanate $(3.5MgO.0.5MgF_2.(Ge_{0.75}Mn_{0.25})O_2)$ phosphor of which average particle size is 12 μm is prepared as the deep red (DR) phosphor.

Respective phosphors are mixed with ratios illustrated in Table 2, and the LED light bulbs are manufactured by using these mixed phosphors as described below. At first, the phosphor is dispersed in the silicon resin as the binder resin and it is deaerated. Next, the phosphor slurry having the amount to be a desired film thickness is input into the globe, and the globe is rotated while changing an angle thereof so that the phosphor slurry evenly spreads at the inner surface of the globe. Next, the heating is performed by using an infrared heater, a drier, and so on until the phosphor slurry begins to be cured and the coating film does not flow. After that, a heat treatment is performed with a condition of approximately 100° C.×five hours by using an oven and so on to completely cure the coating film of the phosphor slurry. The film thickness of the phosphor screen is 300 μm to 600 μm.

As for the LED module, it is constituted such that 112 pieces of LED chips each of which light emission peak wavelength is 405 nm, half value width of the emission spectrum is 15 nm are used, these LED chips are surface-mounted on the substrate, further, it is coated by the silicon resin. Besides, as for the globe, one which is made up of translucent polycarbonate of which transmittance of visible light is 88%, having a dome shape of which thickness is approximately 1 mm is used. Property evaluations as described below are performed for the LED light bulbs obtained as stated above.

Comparative Examples 1 to 2

An LED light bulb is manufactured as same as the example 1 except that the green to yellow phosphor illustrated in Table 2 is dispersed in a resin layer covering the blue light emitting LED chips (light emission peak wavelength: 450 nm). The phosphor screen is not formed at the inner surface of the globe. Property evaluations as described below are performed for these.

Comparative Example 3

An LED light bulb is manufactured as same as the example 1 except that the mixed phosphor illustrated in Table 2 is dispersed in a resin layer covering the LED chips (light emission peak wavelength: 405 nm). The phosphor screen is not formed at the inner surface of the globe. Property evaluations as described below are performed for these.

Comparative Example 4

An LED light bulb is manufactured as same as the example 1 except that the blue light-emitting LED chips (light emission peak wavelength: 450 nm) is used and the phosphor screen containing only the green to yellow phosphor illustrated in Table 2 is formed at the inner surface of the globe. Property evaluations as described below are performed for these.

TABLE 2

| | Mixed Phosphor Combination* | Mixing ratio [mass %] | Formation position of phosphor screen | LED light emission wavelength (nm) | Body color of phosphor screen L* | a* | b* |
|---|---|---|---|---|---|---|---|
| Example 1 | B phosphor | 17.6 | Globe inner surface | 405 | 74.73 | −4.04 | 14.24 |
| | GY phosphor 2 | 4.1 | | | | | |
| | R phosphor 1 | 78.3 | | | | | |
| Example 2 | B phosphor | 53.6 | Globe inner surface | 405 | 77.88 | −2.55 | 9.50 |
| | GY phosphor 2 | 4.4 | | | | | |
| | R phosphor 1 | 42.0 | | | | | |
| Example 3 | B phosphor | 26.0 | Globe inner surface | 405 | 73.69 | −3.52 | 11.21 |
| | BG phosphor | 0.5 | | | | | |
| | GY phosphor 2 | 3.7 | | | | | |
| | R phosphor 1 | 64.5 | | | | | |
| | DR phosphor | 5.3 | | | | | |
| Example 4 | B phosphor | 53.9 | Globe inner surface | 405 | 75.34 | −3.35 | 13.85 |
| | BG phosphor | 0.5 | | | | | |
| | GY phosphor 2 | 2.5 | | | | | |
| | R phosphor 1 | 40.3 | | | | | |
| | DR phosphor | 2.8 | | | | | |
| Example 5 | B phosphor | 26.0 | Globe inner surface | 405 | 75.20 | −3.14 | 29.50 |
| | BG phosphor | 2.6 | | | | | |
| | GY phosphor 2 | 3.6 | | | | | |
| | R phosphor 4 | 13.8 | | | | | |
| | R phosphor 1 | 54.0 | | | | | |
| Example 6 | B phosphor | 18.8 | Globe inner surface | 405 | 74.10 | −2.10 | 22.00 |
| | GY phosphor 5 | 4.4 | | | | | |
| | R phosphor 1 | 76.8 | | | | | |
| Example 7 | B phosphor | 13.0 | Globe inner surface | 405 | 74.24 | −3.11 | 10.38 |
| | GY phosphor 1 | 17.0 | | | | | |
| | R phosphor 2 | 70.0 | | | | | |
| Example 8 | B phosphor | 41.3 | Globe inner surface | 405 | 75.62 | −2.44 | 23.60 |
| | GY phosphor 3 | 4.7 | | | | | |
| | R phosphor 2 | 43.0 | | | | | |
| | R phosphor 3 | 11.0 | | | | | |
| Example 9 | B phosphor | 22.0 | Globe inner surface | 405 | 73.15 | −3.62 | 16.35 |
| | GY phosphor 4 | 10.0 | | | | | |
| | R phosphor 1 | 68.0 | | | | | |
| Comparative Example 1 | GY phosphor 5 | 80.0 | Within LED coating resin | 450 | (Translucent globe) | | |
| | R phosphor 3 | 20.0 | | | | | |
| Comparative Example 2 | GY phosphor 3 | 100 | Within LED coating resin | 450 | (Translucent globe) | | |
| Comparative Example 3 | B phosphor 1 | 17.6 | Within LED coating resin | 405 | (Translucent globe) | | |
| | GY phosphor 2 | 4.1 | | | | | |
| | R phosphor 1 | 78.3 | | | | | |
| Comparative Example 4 | GY phosphor 5 | 80.0 | Within LED coating resin | 450 | 69.40 | −5.71 | 50.41 |
| | R phosphor 3 | 20.0 | | | | | |

Next, the body color (L*a*b*) of the phosphor screen is measured by using Spectro Photo Meter CM2500d manufactured by Konica-Minolta as for each of the LED light bulbs of the examples 1 to 9 and the comparative examples 1 to 4. Each LED light bulb is lighted, and the brightness (emission efficiency) of the white light emitted from each LED light bulb, the correlated color temperature, the average color rendering index Ra, the luminance deterioration characteristics after 200 hours continuous lighting are measured. These properties are measured by an SLMS total luminous flux measurement system manufactured by Labsphere. Further, the light distribution angle of each LED light bulb is measured by an illuminometer T-10 manufactured by Konica-Minolta. These measurement and evaluation results are illustrated in Table 3. The luminance deterioration characteristics are evaluated in four stages, a rejected one is illustrated by "X", and ones in accepted level are illustrated by three stages of "A", "B", "C" from better one.

TABLE 3

| | Light distribution angle (degree) | Brightness [lm/W] | Color temperature [K] | Ra | Luminance deterioration characteristices |
|---|---|---|---|---|---|
| Example 1 | 200 | 50 | 2700 | 94 | B |
| Example 2 | 200 | 77 | 5000 | 91 | B |
| Example 3 | 200 | 51 | 2800 | 96 | B |
| Example 4 | 200 | 71 | 5000 | 94 | B |
| Example 5 | 200 | 49 | 2800 | 92 | B |
| Example 6 | 200 | 54 | 3000 | 86 | B |
| Example 7 | 200 | 63 | 5000 | 85 | B |
| Example 8 | 200 | 60 | 2800 | 90 | B |
| Example 9 | 200 | 65 | 2800 | 91 | B |
| Comparative Example 1 | 140 | 55 | 2800 | 87 | C |
| Comparative Example 2 | 140 | 89 | 5000 | 75 | C |

TABLE 3-continued

| | Light distribution angle (degree) | Brightness [lm/W] | Color temperature [K] | Ra | Luminance deterioration characteristices |
|---|---|---|---|---|---|
| Comparative Example 3 | 140 | 49 | 2700 | 93 | X |
| Comparative Example 4 | 180 | 60 | 2800 | 86 | B |

As it is obvious from Tables 2 to 3, the body colors of the phosphor screens are good, and a practical emission color (white), brightness, and color rendering properties are held in the LED light bulbs according to the examples 1 to 9. Further, it turns out that the light distribution angle is large and the luminance deterioration over time is little in the LED light bulbs according to the examples 1 to 9. On the other hand, it turns out that the light distribution angle is small and the luminance deterioration over time is large in the LED light bulbs according to the comparative examples 1 to 3 in which the phosphor is dispersed in the resin layer covering the LED chips. The light distribution angle is improved in the LED light bulb of the comparative example 4 in which the phosphor screen containing only the green to yellow phosphor is formed at the inner surface of the globe compared to the comparative examples 1 to 3, but it is verified that the light distribution angle is smaller and the color rendering properties of the white light deteriorate compared to the examples 1 to 9.

Incidentally, the above-described embodiments are to be considered in all respects as illustrative and no restrictive. Namely, these novel embodiments can be carried out in various other forms, and various omissions, substitutions, and changes can be made therein without departing from the spirit of the invention. These embodiments and modifications thereof are included in the scope and the spirit of the invention and included in the inventions described in the claims and the scope of equivalents of the inventions.

What is claimed is:

1. An LED light bulb, comprising:
   an LED module including a substrate and an ultraviolet to violet light-emitting LED chip mounted on the substrate;
   a base part on which the LED module is disposed;
   a globe attached to the base part to cover the LED module;
   a phosphor screen, provided on an inner surface of the globe separately from the LED chip, emitting white light by absorbing ultraviolet to violet light emitted from the LED chip;
   a lighting circuit, provided in the base part, lighting the LED chip; and
   a bayonet cap electrically connected to the lighting circuit,
   wherein the phosphor screen includes a mixed phosphor containing a blue phosphor, a green to yellow phosphor, and a red phosphor,
   wherein the blue phosphor comprises an europium activated alkaline earth chlorophosphate phosphor having a composition represented by a general formula:

$$(Sr_{1-x-y-z}Ba_xCa_yEu_z)_5(PO_4)_3Cl \quad (1)$$

where, x, y, and z are numbers satisfying $0 \le x < 0.5$, $0 \le y < 0.1$, $0.0005 \le z < 0.1$, wherein the green to yellow phosphor comprises at least one selected from: an europium and manganese activated alkaline earth aluminate phosphor having a composition represented by a general formula:

$$(Ba_{1-x-y-z}Sr_xCa_yEu_z)(Mg_{1-u}Mn_u)Al_{10}O_{17} \quad (2)$$

where, x, y, z, and u are numbers satisfying $0 \le x < 0.2$, $0 \le y < 0.1$, $0.005 < z < 0.5$, $0.1 < u < 0.5$;

an europium and manganese activated alkaline earth silicate phosphor having a composition represented by a general formula:

$$(Sr_{1-x-y-z-u}Ba_xMg_yEu_zMn_u)_2SiO_4 \quad (3)$$

where, x, y, z, and u are numbers satisfying $0.1 \le x \le 0.35$, $0.025 \le y \le 0.105$, $0.025 \le z \le 0.25$, $0.0005 \le u \le 0.02$;

a cerium activated rare-earth aluminate phosphor having a composition represented by a general formula:

$$RE_3A_xAl_{5-x-y}B_yO_{12}:Ce_z \quad (4)$$

where, RE is at least one element selected from Y, Lu, and Gd, A and B are a pair of elements where (A, B) is an of (Mg, Si), (B, Sc), (B, In), and x, y, and z are numbers satisfying $x<2$, $y<2$, $0.9<x/y \le 1.1$, $0.05 \le z \le 0.5$;

an europium activated SiAlON phosphor having a composition represented by a general formula:

$$(Si,Al)_6(O,N)_8:Eu_x \quad (5)$$

where, x is a number satisfying $0<x<0.3$; and an europium activated SiAlON phosphor having a composition represented by a general formula:

$$(Sr_{1-x}Eu_x)_\alpha Si_\beta Al_\gamma O_\delta N_\omega \quad (6)$$

where, x, α, β, γ, δ, and ω are numbers satisfying $0<x<1$, $0<\alpha \le 3$, $12 \le \beta \le 14$, $2 \le \gamma \le 3.5$, $1 \le \delta \le 3$, $20 \le \omega \le 22$, wherein the red phosphor comprises at least one selected from: an europium activated lanthanum oxysulfide phosphor having a composition represented by a general formula:

$$(La_{1-x-y}Eu_xM_y)_2O_2S \quad (7)$$

where, M is at least one element selected from Sm, Ga, Sb, and Sn, and x and y are numbers satisfying $0.08 \le 0.16$, $0.000001 \le y < 0.003$;

an europium activated yttrium oxide phosphor having a composition represented by a general formula:

$$(Y_{1-x-y}Eu_xBi_y)_2O_3 \quad (8)$$

where, x and y are numbers satisfying $0.01 \le x < 0.15$, $0.001 \le y < 0.05$;

an europium activated CASN phosphor having a composition represented by a general formula:

$$(Ca_{1-x-y}Sr_xEu_y)SiAlN_3 \quad (9)$$

where, x and y are numbers satisfying $0 \le x < 0.4$, $0 < y < 0.5$; and an europium activated SiAlON phosphor having a composition represented by a general formula:

$$(Sr_{1-x}Eu_x)_\alpha Si_\beta Al_\gamma O_\delta N_\omega \quad (10)$$

where, x, α, β, γ, δ, and ω are numbers satisfying $0<x<1$, $0<\alpha \le 3$, $5 \le \beta \le 9$, $1 \le \gamma \le 5$, $0.5 \le \delta \le 2$, $5 \le \omega \le 15$, wherein a total content of the europium and manganese activated alkaline earth silicate phosphor having the composition represented by the formula (3), the cerium activated rare-earth aluminate phosphor having the composition represented by the formula (4), the europium activated SiAlON phosphor having the composition represented by the formula (5), the europium activated SiAlON phosphor having the composition represented by the formula (6), the europium activated CASN phosphor having the composition represented by the formula (9), and the europium activated SiAlON phosphor having the composition represented by the formula (10) in the mixed phosphor is 20 mass % or less, and wherein the phosphor screen has a color in which a* is −10 or more and +10 or less, b* is 0 (zero) or more and +30 or less, and L* is +40 or more when a body color of the phosphor screen is represented by an L*a*b* color system.

2. The LED light bulb according to claim 1,
wherein the LED module includes a plurality of the LED chips mounted on the substrate and a transparent resin layer provided on the substrate to cover the plurality of LED chips.

3. The LED light bulb according to claim 1,
wherein the globe has a dome shape or an eggplant shape.

4. The LED light bulb according to claim 1,
wherein the mixed phosphor contains 10 mass % or more and 60 mass % or less of the blue phosphor, 1 mass % or more and 30 mass % or less of the green to yellow phosphor, and 30 mass % or more and 90 mass % or less of the red phosphor, where a total amount of the blue, green to yellow, and red phosphors is 100 mass %.

5. The LED light bulb according to claim 1,
wherein the white light emitted from the phosphor screen has a correlated color temperature of 6500 K or less and an average color rendering index Ra of 85 or more.

6. The LED light bulb according to claim 1,
wherein the mixed phosphor further contains at least one selected from a blue-green phosphor and a deep red phosphor.

7. The LED light bulb according to claim 6,
wherein the blue-green phosphor comprises an europium and manganese activated alkaline earth silicate phosphor having a composition represented by a general formula:

$$(Ba_{1-x-y-z-u}Sr_xMg_yEu_zMn_u)_2SiO_4 \qquad (11)$$

where, x, y, z, and u are numbers satisfying $0.1 \le x \le 0.35$, $0.025 \le y \le 0.105$, $0.025 \le z \le 0.25$, $0.0005 \le u \le 0.02$, and wherein the deep red phosphor comprises a manganese activated magnesium phlorogermanate phosphor having a composition represented by a general formula:

$$\alpha MgO \cdot \beta MgF_2 \cdot (Ge_{1-x}Mn_x)O_2 \qquad (12)$$

where, $\alpha$, $\beta$, and x are numbers satisfying $3 \le \alpha \le 4$, $0.04 \le \beta \le 0.6$, $0.001 \le x \le 0.5$.

8. The LED light bulb according to claim 6,
wherein the mixed phosphor contains 10 mass % or more and 60 mass % or less of the blue phosphor, 10 mass % or less of the blue-green phosphor, 1 mass % or more and 30 mass % or less of the green to yellow phosphor, 30 mass % or more and 90 mass % or less of the red phosphor, and 35 mass % or less of the deep red phosphor, where a total amount of the blue, blue-green, green to yellow, red, and deep red phosphors is 100 mass %.

9. The LED light bulb according to claim 7,
wherein a total content of the europium and manganese activated alkaline earth silicate phosphor having the composition represented by the formula (3), the cerium activated rare-earth aluminate phosphor having the composition represented by the formula (4), the europium activated SiAlON phosphor having the composition represented by the formula (5), the europium activated SiAlON phosphor having the composition represented by the formula (6), the europium activated CASN phosphor having the composition represented by the formula (9), the europium activated SiAlON phosphor having the composition represented by the formula (10), and the europium and manganese activated alkaline earth silicate phosphor having the composition represented by the formula (11) in the mixed phosphor is 20 mass % or less.

10. The LED light bulb according to claim 1,
wherein the phosphor screen has a film thickness in a range of 80 μm or more and 800 μm or less.

11. The LED light bulb according to claim 1,
wherein the globe is made of a material having a body color of transparent or white, and of Which transmittance of visible light is 90% or more.

12. The LED light bulb according to claim 1,
wherein the ultraviolet to violet light emitted from the LED chip has a emission peak wavelength in a range of 370 nm or more and 415 nm or less, and a half value width of emission spectrum in a range of 10 nm or more and 15 nm or less.

* * * * *